(12) United States Patent
Namou et al.

(10) Patent No.: US 10,017,071 B2
(45) Date of Patent: Jul. 10, 2018

(54) METHOD AND SYSTEM FOR DIAGNOSING CONTACTOR HEALTH IN A HIGH-VOLTAGE ELECTRICAL SYSTEM

(71) Applicant: GM GLOBAL TECHNOLOGY OPERATIONS LLC, Detroit, MI (US)

(72) Inventors: Andrew J. Namou, West Bloomfield, MI (US); Syed M. Kadry, Grand Blanc, MI (US); Ahmad Albanna, Dearborn Heights, MI (US); Mohammad N. Anwar, Van Buren Township, MI (US); David J. Mifsud, Novi, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 117 days.

(21) Appl. No.: 15/292,456

(22) Filed: Oct. 13, 2016

(65) Prior Publication Data

US 2018/0105059 A1   Apr. 19, 2018

(51) Int. Cl.
| | |
|---|---|
| *B60R 16/03* | (2006.01) |
| *B60L 11/18* | (2006.01) |
| *H02J 7/00* | (2006.01) |
| *H02P 27/08* | (2006.01) |
| *G01R 31/36* | (2006.01) |
| *H02J 7/34* | (2006.01) |

(52) U.S. Cl.
CPC ....... *B60L 11/1864* (2013.01); *B60L 11/1803* (2013.01); *B60L 11/1861* (2013.01); *G01R 31/3679* (2013.01); *H02J 7/0045* (2013.01); *H02J 7/0072* (2013.01); *H02P 27/08* (2013.01); *H02J 7/345* (2013.01)

(58) Field of Classification Search
CPC ............................. B60L 11/1803; B60R 16/03
See application file for complete search history.

(56) References Cited

U.S. PATENT DOCUMENTS

| | | | |
|---|---|---|---|
| 2013/0035819 A1* | 2/2013 | Wolft ................... | G01R 31/007 701/22 |
| 2014/0218826 A1* | 8/2014 | Majarov ............... | H02H 7/122 361/18 |
| 2016/0146901 A1* | 5/2016 | Ohta ................... | G01R 31/3278 324/538 |

\* cited by examiner

*Primary Examiner* — Rexford Barnie
*Assistant Examiner* — Terrence Willoughby
(74) *Attorney, Agent, or Firm* — Quinn IP Law

(57) ABSTRACT

An electrical system includes a voltage bus, battery pack, power inverter module (PIM), electric machine, first contactor, and controller. The PIM is connected to the battery pack and has a capacitor, voltage sensor, and semiconductor switches. The electric machine having phase legs with a corresponding phase winding and resistive path. The first contactor connects the PIM to a positive rail of the bus. The controller opens the first contactor in response to a power-off event, commands a discharge of the capacitor through the resistive paths, diagnoses a state of health (SOH) of the first contactor using a first threshold decay rate of the capacitor output voltage upon opening the first contactor, and executes a control action with respect to the electrical system using the diagnosed SOH. The three possible SOH are unhealthy/hard-welded contactor, unhealthy/soft-welded contactor, and healthy/normally-functioning contactor condition. A vehicle and method are also disclosed.

19 Claims, 4 Drawing Sheets

| MC | NC | CC | CA-D | CA-C |
|---|---|---|---|---|
| H | H | H | Y | Y |
| H | H | U (S/H) | Y | D/Y |
| H | U (S/H) | H | L/Y | D/Y |
| H | U (S/H) | U (S/H) | L/Y | D/Y |
| U (S/H) | H | H | L/Y | N |
| U (S/H) | H | U (S/H) | L/Y | N |
| U (S/H) | U (S/H) | H | L/Y | N |
| U (S/H) | U (S/H) | U (S/H) | L/Y | N |

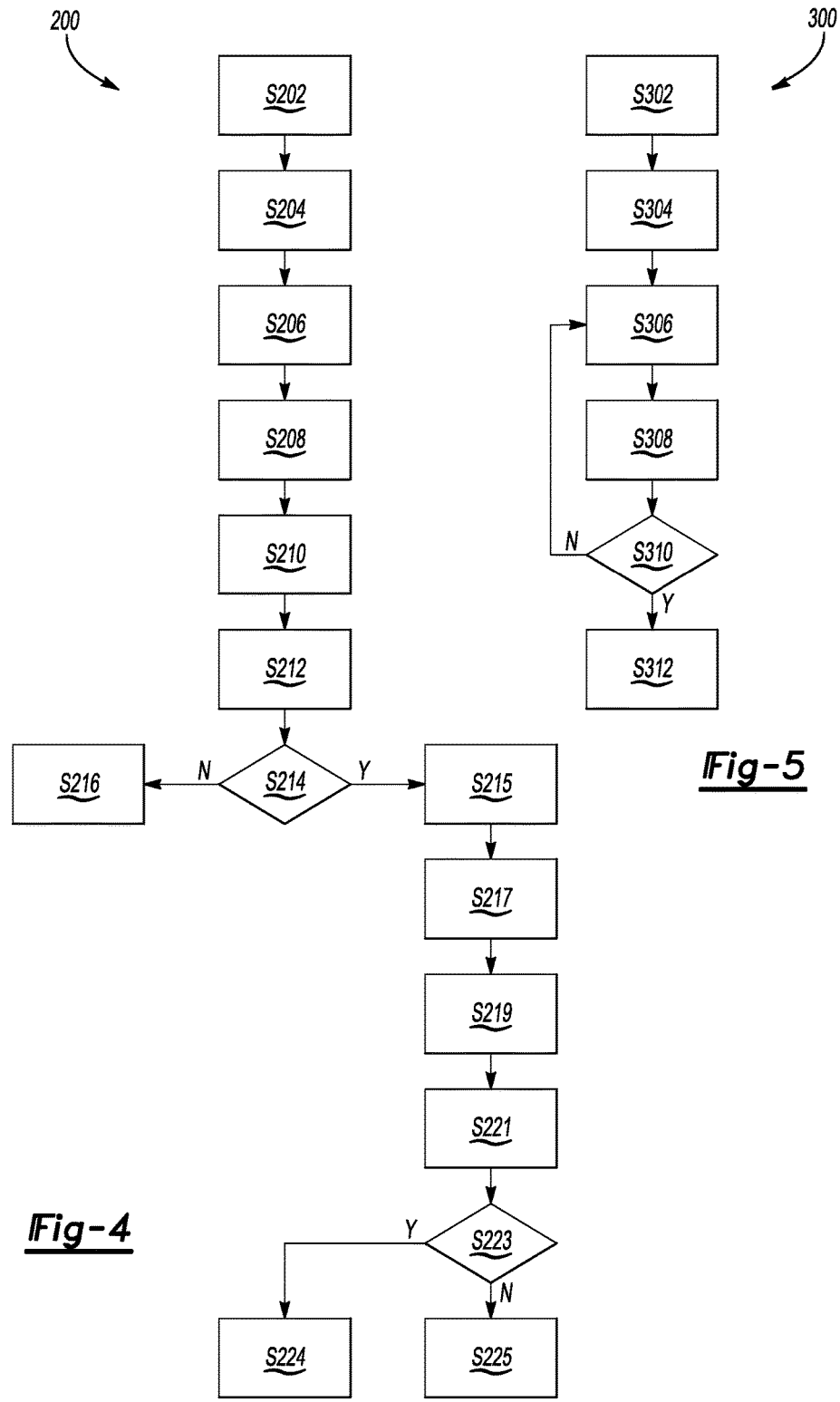

METHOD AND SYSTEM FOR DIAGNOSING CONTACTOR HEALTH IN A HIGH-VOLTAGE ELECTRICAL SYSTEM

INTRODUCTION

The present disclosure relates to diagnosing contactor health in a high-voltage electrical system. Such electrical systems may include an electric machine and one or more other electrical components, each of which is energized by a battery pack or other direct current (DC) power supply. When the electric machine is an alternating current (AC) device, a power inverter module (PIM) may be connected to the battery pack and controlled via pulse width modulation or other suitable switching signals to produce an AC output voltage. The AC output voltage is then delivered to individual phase windings of the electric machine via control of the PIM to enable the electric machine to generate a motor output torque. In an example electric vehicle configuration, for instance, the motor output torque can be used to propel the vehicle, either alone or in combination with torque from an internal combustion engine.

In high-voltage embodiments, it is desirable to automatically disconnect the battery pack from the electric machine, the PIM, and any other protected devices when the electrical system is not in use. For this reason, high-voltage switches referred to as contactors are positioned in the electrical circuit on a high-voltage bus between the battery pack and any protected devices. A contactor uses an electromagnet to open and close conductive mechanical contacts connected to the high-voltage bus, with closure of the mechanical contacts forming a low-resistance circuit connection. Opening of the mechanical contacts thus breaks the circuit connection to the battery pack, thereby disconnecting the battery pack.

SUMMARY

A method is disclosed herein for diagnosing a state of health (SOH) of one or more contactors in a high-voltage electrical system having a battery pack, a power inverter module (PIM), and an electric machine, e.g., a polyphase electric traction motor. The method may be embodied as computer-readable instructions executed via a controller using sensor input from current or voltage sensors located within the PIM. Execution of the method set forth herein determines (a) whether the contactors are in a healthy/unwelded SOH or an unhealthy/welded SOH, and (b) when the contactors are in an unhealthy/welded SOH, whether the contactors have experienced a "hard weld" condition or a "soft weld" condition.

A welded contactor condition resulting in a threshold low resistance across the internal mechanical contacts of the contactor is considered herein to be a hard weld condition. Conversely, a threshold high contact resistance across the contactor is considered to be a soft weld condition. Either condition may lead to a deep discharge and possible degradation of the battery pack. A control action is therefore executed in response to the present SOH diagnosis, with limited functionality permitted in response to particular unhealthy/welded states without necessarily having to disable operation of the electrical system.

In a particular embodiment, an electrical system includes a high-voltage bus having positive and negative rails, a battery pack connected to the positive and negative rails, and a PIM connected to the battery pack and having each of a capacitor, a voltage sensor configured to measure an output voltage across the capacitor, and a plurality of semiconductor switches. The electrical system also includes an electric machine that is electrically connected to the PIM and having a plurality of phase legs each with a corresponding phase winding and resistive path, a first contactor electrically connecting the PIM to the positive rail, and a controller in communication with the semiconductor switches, the voltage sensor, and the current sensors.

The controller in this embodiment is programmed to open the first contactor in response to a power-off event of the electrical system, command a discharge of the link capacitor through the resistive paths of the electric machine via control of the semiconductor switches, diagnose an SOH of the first contactor as being one of three possible SOH using a first threshold decay rate of the output voltage upon opening the first contactor, and execute a control action with respect to the electrical system using the diagnosed SOH, wherein the three possible SOH are an unhealthy/hard-welded contactor condition, an unhealthy/soft-welded contactor condition, and a healthy/normally-functioning contactor condition.

The controller may be programmed to command a d-axis current of the electric machine after opening the first contactor to thereby command the discharge of the capacitor.

The electrical system may include a pre-charge circuit having a pre-charge resistor and a pre-charge switch, and a second contactor positioned between a negative terminal of the battery pack and the negative rail. In such an embodiment, the controller is programmed to close the first contactor, charge the link capacitor via the pre-charge circuit, close the second contactor after the link capacitor is charged above a pre-charge threshold, and then diagnose an SOH of the second contactor as being one of the three possible SOH using a second threshold voltage decay rate of the output voltage.

The electrical system may also include an onboard charging module (OBCM) configured to selectively output a constant voltage or a constant current in response to an corresponding input signal from the controller, and a third contactor positioned between the OBCM and the positive rail. The controller is further programmed, when the second contactor has the healthy/normally-functioning condition, to detect a plug-in event of the electrical system, measure the output voltage, close the first contactor, command a constant voltage from the OBCM at a level higher by a calibrated voltage offset than the measured output voltage, measure the output voltage after a calibrated duration as a second measured capacitor output voltage, and diagnose the SOH of the third contactor using the second measured capacitor output voltage and the calibrated voltage offset.

When the SOH is the unhealthy/hard-welded or unhealthy/soft-welded contactor condition, the controller may set the OBCM to output the constant current, discharge the link capacitor through the electric machine, measure an output voltage of the OBCM and the output voltage, calculate a difference between the measured output voltage and the measured output voltage, and diagnose which of the unhealthy/hard-welded and unhealthy/soft-welded conditions are present by comparing the calculated difference to a third voltage threshold.

The control action may include allowing limited charging of the battery pack when the SOH of the third contactor is unhealthy/hard-welded or unhealthy/soft-welded and the SOH of the first contactor is healthy/not welded. Alternatively, the control action may include preventing charging of the battery pack when the SOH of the first contactor is unhealthy/hard-welded or unhealthy/soft-welded, or allowing the vehicle to be propelled via the traction motor in at least a limited capacity regardless of the diagnosed SOH of the first contactor.

The controller may be optionally programmed to disable propulsion of the vehicle after a calibrated number of drive cycles of the vehicle when operating in the limited capacity.

A vehicle is disclosed herein that, in an embodiment, includes a high-voltage bus having positive and negative rails, a battery pack connected to the positive and negative rails, and a PIM connected to the battery pack and having a capacitor, a voltage sensor configured to measure an output voltage across the capacitor, and a plurality of semiconductor switches. The vehicle also includes a traction motor that is electrically connected to the PIM, and that includes a plurality of phase legs each with a corresponding phase winding and resistive path. The traction motor outputs torque to propel the vehicle, and a first contactor electrically connects the PIM to the positive rail.

A controller in this embodiment is in communication with the semiconductor switches, the voltage sensor, and the current sensors, and is programmed to open the first contactor in response to a power-off event of the electrical system, command a discharge of the link capacitor through the resistive paths of the electric machine by commanding a d-axis current of the electric machine after opening the first contactor, diagnose an SOH of the first contactor as being one of three possible SOH using a first threshold decay rate of the output voltage upon opening the first contactor, and execute a control action with respect to the electrical system using the diagnosed SOH. The three possible SOH are an unhealthy/hard-welded contactor condition, an unhealthy/soft-welded contactor condition, and a healthy/normally-functioning contactor condition.

A method for diagnosing an SOH of a high-voltage contactor in the electrical system includes opening the first contactor in response to a power-off event of the electrical system and commanding a discharge of the capacitor, via the controller, through the resistive paths of the electric machine, including commanding a d-axis current of the electric machine. The method also includes diagnosing an SOH of the first contactor as being one of three SOH using a first threshold decay rate of the output voltage upon opening the first contactor. One of a plurality of control actions is executed with respect to the electrical system as part of the method using the diagnosed SOH. As noted above, the three possible SOH are an unhealthy/hard-welded contactor condition, an unhealthy/soft-welded contactor condition, and a healthy/normally-functioning contactor condition.

The above-noted and other features and advantages of the present disclosure are readily apparent from the following detailed description of the best modes for carrying out the disclosure when taken in connection with the accompanying drawings.

BRIEF DESCRIPTION OF THE DRAWINGS

FIGS. 3-5 are flow charts describing different phases of the present method for diagnosing welded contactors in the electrical system shown in FIG. 1.

DETAILED DESCRIPTION

Figure 1:
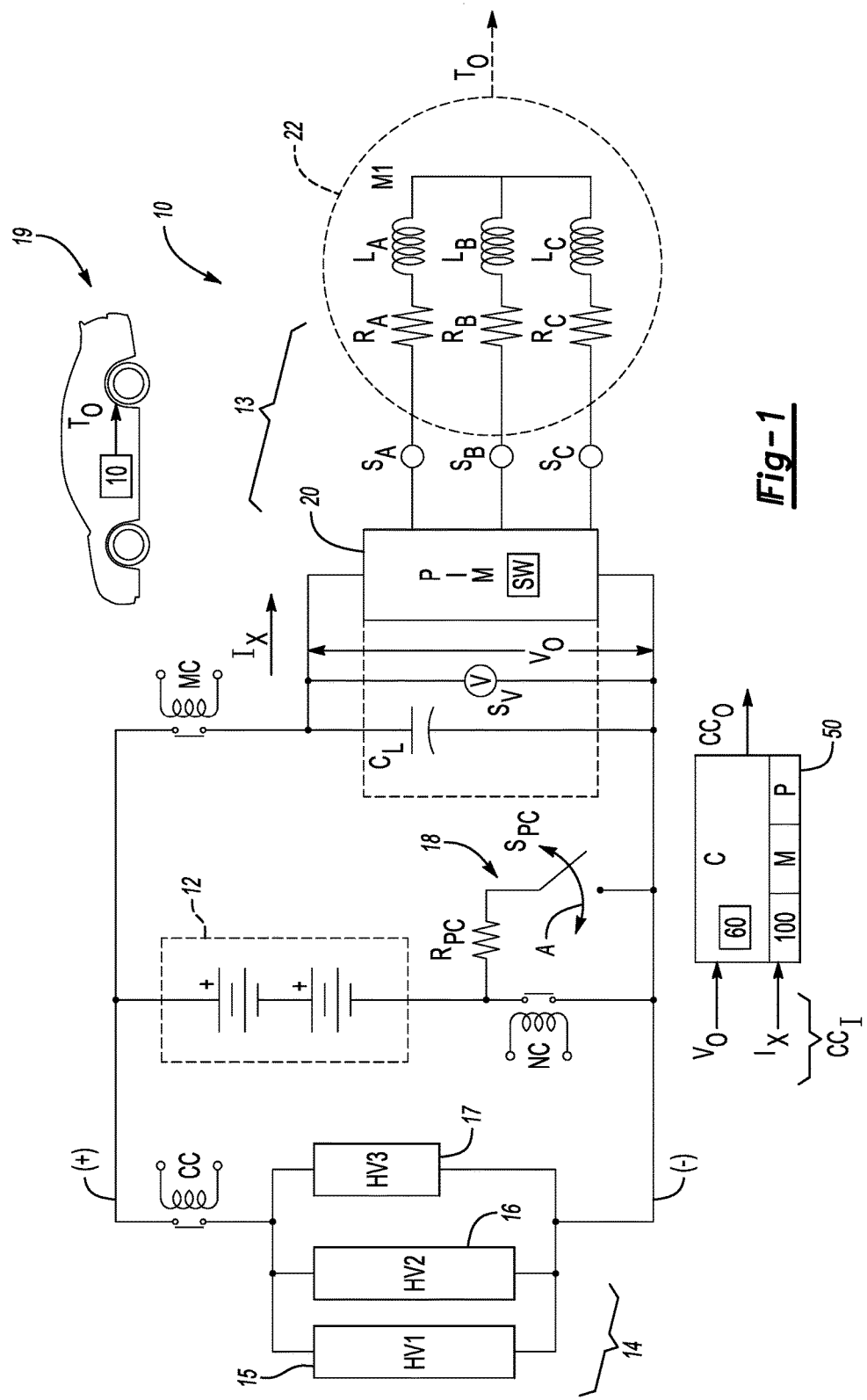
FIG. 1 is a schematic circuit diagram of an example electrical system having a polyphase electric machine, power inverter module, battery pack, and contactors that are diagnosed via a controller as set forth herein.

With reference to the drawings, wherein like reference numbers refer to the same or similar components throughout the several views, and beginning with FIG. 1, an example electrical system 10 includes a direct current (DC) battery pack 12 that is electrically connected to one or more high-voltage (HV) components 14 via positive and negative (+, −) HV bus bars or rails as shown. The electrical system 10 in the representative embodiment of FIG. 1 includes a plurality of HV contactors, i.e., a main contactor (MC), a negative rail contactor (NC), and an optional charge contactor (CC), the functions of each of which are explained below.

A controller (C) 50 having memory (M) and a processor (P) is used as part of the electrical system 10 in order to execute instructions embodying a method 100, and for diagnosing a state of health (SOH) of the various contactors (MC, NC, CC) as set forth below with reference to FIGS. 2-5. In particular, the controller 50 acts by determining a relative severity of a welded/unhealthy state of the contactors (MC, NC, CC) in terms of whether the contactors have experienced a hard weld or a soft weld condition. The controller 50 then executes control actions with respect to the electrical system 10 based on the SOH diagnosis as explained with reference to FIG. 6.

The HV components 14 of FIG. 1 may include, by way of example, a first, second, and third HV component 15, 16, and 17, respectively. In a non-limiting example vehicle application, the first HV component 15, also labeled HV1, is embodied as an onboard charging module (OBCM) or battery charger, i.e., having a controllable constant voltage or current in different modes. This capability is used in some embodiments when diagnosing the SOH of the charge contactor (CC). The second HV component 16, labeled HV2, may be embodied as an auxiliary power module or DC-DC converter operable for reducing a DC voltage level of the battery pack 12 to 12-15 VDC auxiliary levels. The third HV component 17, labeled HV3, may be any other HV component used in a vehicle, e.g., an air conditioning compressor, voltage regulator, etc. While three HV components 14 are depicted for illustrative purposes, any number of HV components 14 may be used within the intended inventive scope.

The main contactor (MC) is selectively opened by transmission of contactor control signals (arrow $CC_O$) from the controller 50 to disconnect the battery pack 12 from an electrical circuit 13. As explained in more detail below, the electrical circuit 13 includes a power inverter module (PIM) 20 and an electric machine (M1) 22. Opening of the main contactor (MC) may be a default control action of the controller 50 upon a key-off in an embodiment in which the electrical system 10 is used to power the electric machine 22 embodied as a traction motor in a vehicle 19, i.e., with output torque (arrow $T_O$) from the electric machine 22 used to propel the vehicle 19, or in a similar requested power-off event in non-vehicular applications.

With respect to the negative rail contactor (NC), this hardware switching device is used as part of a pre-charge circuit 18, i.e., having a pre-charge resistor ($R_{PC}$) and a pre-charge switch ($S_{PC}$), with the latter opening or closing in response to a corresponding command from the controller 50. In operation, the negative rail contactor (NC) is normally closed such that a voltage across the battery pack 12 is provided to the electrical circuit 13. Sequencing of the open/closed states of the negative rail contactor (NC) and the pre-charge switch ($S_{PC}$) is controlled by the controller 50 in normal operation so as to prevent a large inrush current across the negative rail contactor (NC), which could result in the welding of mechanical contacts of the negative rail contactor (NC) to the negative rail (−).

The charge contactor (CC) serves to disconnect the HV components 14 from the battery pack 12 during charging of the battery pack 12, again via control operation of the controller 50. In certain embodiments, some or all of the HV components 14 may be omitted, such as when using a battery pack 12 solely to power the electric machine 22, or a separate contactor (not shown) may be positioned between the HV components 14 and the negative rail (−). That is, in the embodiment pictured in FIG. 1 the battery pack 12 and the HV components 14 share the negative rail (−) of the HVDC voltage bus. This configuration can be modified via placement of a substantially identical charge contactor (CC) between the HV components 14 and the negative rail (−). In such an embodiment, the sequencing of the diagnostic method 100 may be altered as explained with reference to FIGS. 3-5 below.

With continued reference to FIG. 1, the electric machine 22 may be optionally embodied as a polyphase synchronous or induction-type motor/generator. As such, the electric machine 22 may include multiple sets of phase windings, respectively labeled $L_A$, $L_B$, and $L_C$ in the three-phase embodiment that is depicted. Such phases are customarily referred to as phases A, B, and C for simplicity, with this convention maintained herein. A three-phase electric motor has three phase legs, each 120° out of phase with respect to the other phase legs. Each phase leg has a corresponding phase resistance ($R_A$, $R_B$, $R_C$). Current sensors ($S_A$, $S_B$, $S_C$) may be used on two or three phase legs to measure the corresponding phase current for a given phase leg, with the measured phase currents reported to the controller 50 as one of many input signals (arrow $CC_I$) set forth herein. Thus, when the controller 50 commands a d-axis current to discharge a DC link capacitor ($C_L$) of the PIM 20 as set forth below, the value of the d-axis current may be measured by the current sensors $S_A$, $S_B$, and $S_C$.

The PIM 20, which is electrically connected to the battery pack 12 and the electric machine 22, is in communication with and controllable via the controller 50. A power inverter such as the example PIM 20 of FIG. 1 includes various internal electronic components, including the DC link capacitor ($C_L$), a voltage sensor ($S_V$) operable for measuring a capacitor output voltage ($V_O$) across the capacitor ($C_L$), semiconductor switches (SW), as well as any necessary transistors, diodes, and conductors needed for converting a DC voltage to an AC voltage and vice versa as needed.

While the semiconductor switches (SW) are shown schematically as a collective block for illustrative simplicity, those of ordinary skill in the art will appreciate that IGBTs, MOSFETs, and other high-speed semiconductor switches may be arranged in upper and lower switching pairs to control the power conversion function. Thus, for the example three-phase embodiment of the electric machine 22 of FIG. 1, three switching pairs, with two switching pairs per phase, for a total of six semiconductor switches. Other embodiments may be envisioned depending on the configuration of the electric machine 22.

Additionally, a multi-phase electric machine such as the electric machine 22 may be mathematically represented as having two axes of magnetic symmetry: a direct axis (d-axis) and a quadrature axis (q-axis), as will be readily understood by those of ordinary skill in the art. Motor voltages and currents may be represented as vectors in a d-q coordinate system. The controller 50 is therefore configured to command, as part of its overall control function, a current to be supplied to the respective d-axis and q-axis based on a torque command signal to the electric machine 22. The controller 50 ultimately outputs pulse-width modulation (PWM) or other switching control signals to the individual switches (SW) of the PIM 20 in a particular sequence to provide speed and torque control of the electric machine 22.

Also as part of the functionality of the controller 50, upon shutdown or power-off of the electrical system 10, such as after a key-off event in an vehicle application in which the electric machine 22 delivers the output torque (arrow $T_O$) to a driveline of a vehicle 19 of FIG. 1, the controller 50 commands an active discharge of the capacitor ($C_L$) through the electric machine 22. More specifically, the controller 50 controls the switching states of the various semiconductor switches (SW) of the PIM 20 to bleed off the d-axis current noted above. That is, when the controller 50 opens the main contactor (MC) in response to a key-off event, a significant voltage may remain across the capacitor ($C_L$). In order to discharge the capacitor ($C_L$), the controller 50 commands the d-axis current which dissipates through the resistive paths available in the electric machine 22 as represented by the resistors ($R_A$, $R_B$, and $R_C$) in FIG. 1.

To execute the method 100 and perform other functions noted above, the controller 50 may be embodied as one or more computer devices. The memory (M) may include tangible, non-transitory memory, e.g., read only memory, whether optical, magnetic, flash, or otherwise. The controller 50 also includes sufficient amounts of random access memory, electrically-erasable programmable read only memory, and the like, as well as a high-speed clock, analog-to-digital and digital-to-analog circuitry, and input/output circuitry and devices, as well as appropriate signal conditioning and buffer circuitry.

Additionally, the controller 50 is programmed with a set of state of health (SOH) threshold data 60, some of which corresponds to different voltage decay rates of the DC link capacitor ($C_L$). The SOH threshold data 60 is used by the controller 50 in the method 100 to determine whether the contactors (MC, NC, and CC) are welded/unhealthy or not welded/healthy. The controller 50 also determines whether the unhealthy contactors (MC, NC, and CC) have experienced a hard weld or a soft weld condition. A hard weld is defined herein as a welded contactor condition resulting in a threshold low contact resistance across the contactor. Such a condition is not substantially different from that of a contactor in a closed position. By way of contrast, a soft weld displays a higher contact resistance that is at a level short of an open circuit resistance. Thus, the controller 50 is able to differentiate between hard and soft welds for each contactor (MC, NC, and CC).

Subsequent to this SOH diagnosis, the controller 50 executes a corresponding control action with respect to the electrical system 10. In an electric vehicle powertrain, for instance, the controller 50 may enable limited propulsion functionality or a "limp home" mode rather than disabling vehicle propulsion in the conventional manner, or the controller may record a diagnostic code corresponding to the SOH and limit propulsion for a calibrated duration or number of key/drive cycles in different embodiments. FIG.

6 depicts example control actions that could be used to allow a user of the electrical system 10 to enjoy limited functionality in the time between diagnosis and service of the electrical system 10.

Figures 2, 6:
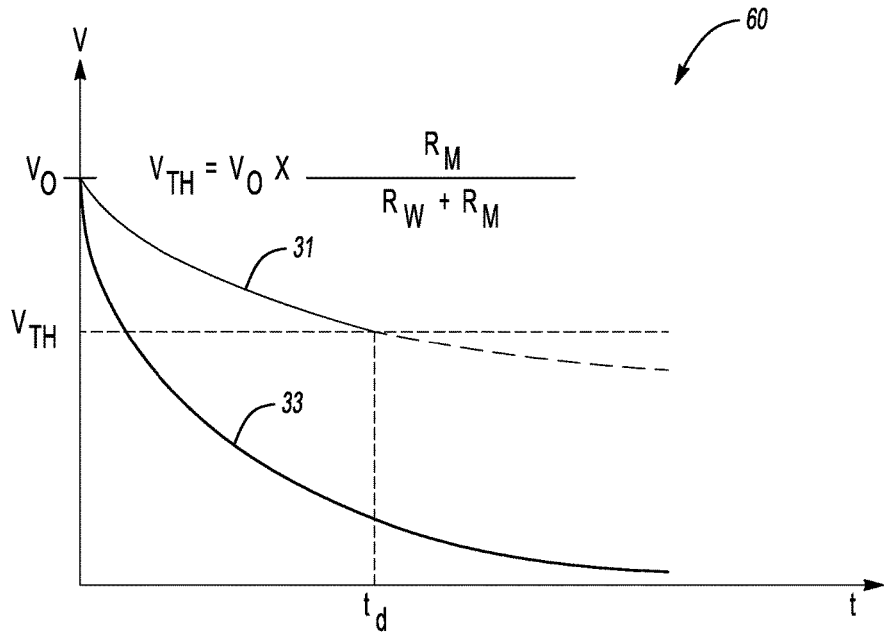
FIG. 2 is a time plot describing a decaying capacitor output voltage used as part of the diagnostic approach of the present method, with time depicted on the horizontal axis and capacitor output voltage depicted on the vertical axis.
FIG. 6 is a truth table describing example diagnostic results and possible control actions.

FIG. 2 depicts an example of the SOH threshold data 60 noted above. The controller 50 may be programmed with a similar curve or data tables representing the same information. As part of the method 100, after opening the main contactor (MC) and commanding the d-axis current to pass into the phase windings of the electric machine 22, the controller 50 examines a rate of decay of the measured capacitor output voltage ($V_O$) across the DC link capacitor ($C_L$) against a calibrated threshold. The calibrated threshold may be represented by the equation:

$$V_{TH} = V_O \times \frac{R_M}{R_W + R_M}$$

with $V_{TH}$ being the calibrated threshold voltage, $R_M$ being an internal resistance of a resistive path of the electric machine 22, and $R_W$ being the resistance of any weld that is present. A relatively slow decay rate will be present if a weld exists across the contactor being evaluated, as the weld resistance $R_W$ in this instance will be relatively low. Assuming that the weld resistance $R_W$ is effectively zero, i.e., a hard weld, the value of $V_O$ will decay relatively slowly before a predetermined duration $t_d$, as represented by trace 31 in FIG. 2. An infinite weld resistance $R_W$ (open circuit) should result in a rapid reduction in the capacitor output voltage ($V_O$) across the capacitor ($C_L$), as indicated by trace 33, which is the expected or healthy result. Thus, an unhealthy contactor is detected by the controller 50 using the method 100 by examining the rate of decay of the capacitor output voltage ($V_O$) relative to the calibrated voltage threshold ($V_{TH}$), which can be determined or calibrated offline by the known or calibrated internal resistance of the electric machine 22.

Figure 3:
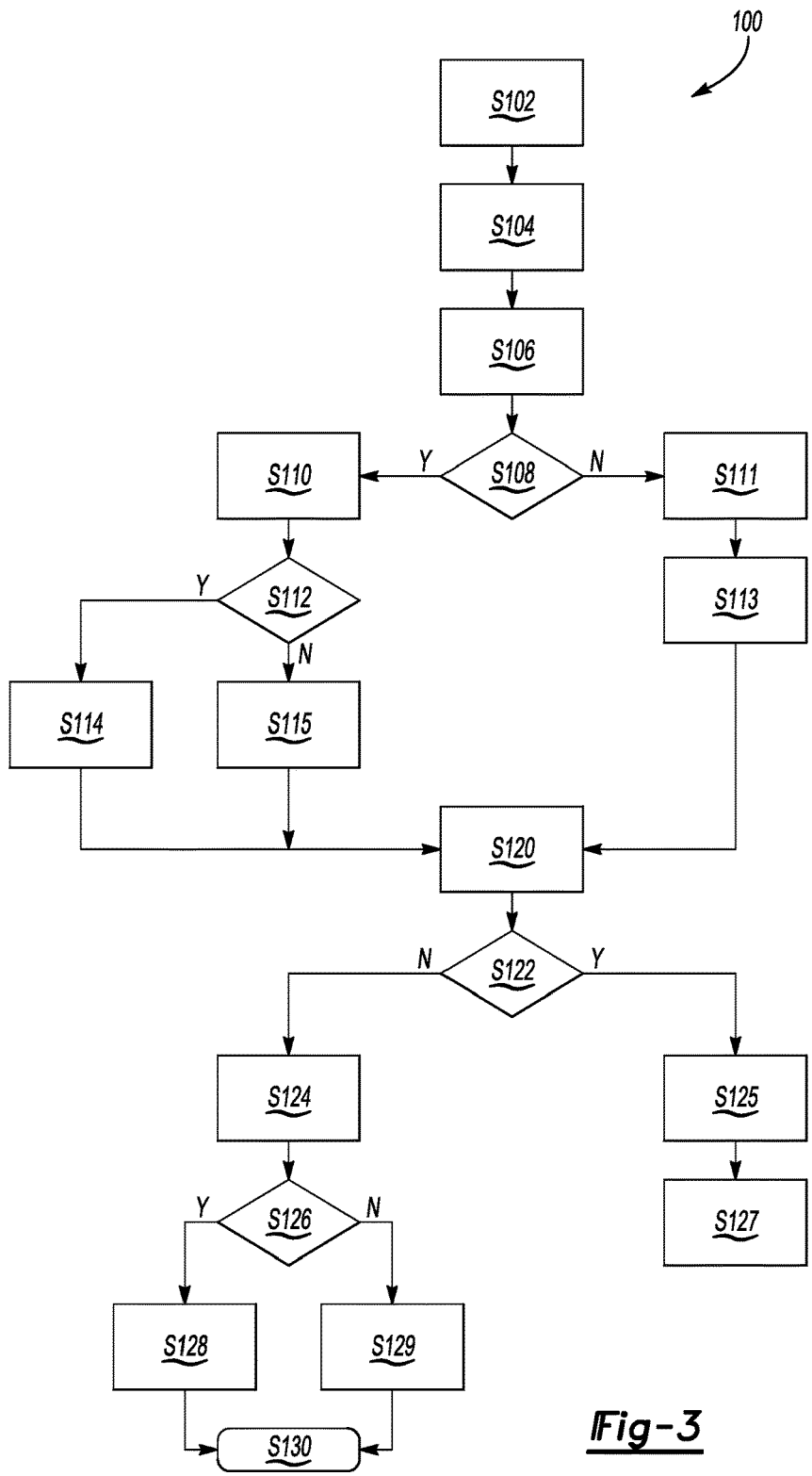

Referring to FIG. 3, an example embodiment of the method 100 begins with step S102, wherein the controller 50 detects a key-off event or other power-off event and, as a result, commands the main contactor (MC) to open via transmission of the control signals (arrow $CC_O$). The method 100 then proceeds to step S104.

Step S104 includes commanding the d-axis current to the semiconductor switches (SW), which is performed by the controller 50 based on a reported measured rotor position of the electric machine 22. That is, as part of the overall control of the electric machine 22 the controller 50 is informed as to present rotor position, for instance from a resolver or encoder (not shown). As part of the discharge of the capacitor ($C_L$) explained above, the controller 50 thus commands the d-axis current and allows the capacitor ($C_L$) to fully discharge through the electric machine 22.

At step S106, the controller 50 determines a rate of decay of the capacitor output voltage ($V_O$), as depicted in FIG. 2. Therefore, step S106 entails receiving the measured capacitor output voltage ($V_O$) from the voltage sensor ($S_V$) of FIG. 1, which is already present in the PIM 20, and as well the measured d-axis current from the sensors $S_A$, $S_B$, and $S_C$.

Step S108 includes comparing the rate of decay of the capacitor output voltage ($V_O$) to the calibrated voltage threshold ($V_{TH}$) described above. The method 100 proceeds to step S110 if the capacitor output voltage ($V_O$) exceeds the calibrated voltage threshold ($V_{TH}$), and to step S111 in the alternative if the capacitor output voltage ($V_O$) is less than the calibrated voltage threshold ($V_{TH}$).

Step S110 includes recording a diagnostic code in memory of the controller 50 that is indicative of the main contactor (MC) being unhealthy, i.e., to some degree welded. For instance, a bit string or bit flag may be recorded. The method 100 then proceeds to step S112.

Step S111 includes recording a diagnostic code indicating that the main contactor (MC) is healthy, i.e., is not welded and is operating as expected. The method then proceeds to step S113.

At step S112, having determined at step S110 that the main contactor is unhealthy, the controller 50 next compares the measured motor current (arrow $I_X$) after discharge of the capacitor ($C_L$) to a first calibrated current threshold, which may be recorded as part of the SOH threshold data 60 shown in FIG. 1. The method 100 proceeds to step S114 when the measured motor current (arrow $I_X$) exceeds the first calibrated current threshold, i.e., when $I_X > I_{TH1}$, where $I_{TH1}$ represents the first current threshold. Step S115 is executed when the opposite is true, i.e., when $I_X <$.

Step S113 includes initiating a pre-charge sequence via the controller 50. In such a sequence, the main contactor (MC) is commanded closed while the negative rail contactor (NC) remains open. The pre-charge sequence commences by commanding a closing of the pre-charge switch ($S_{PC}$). After a calibrated pre-charge duration has elapsed, the pre-charge switch ($S_{PC}$) is again commanded to open to complete the pre-charge sequence. The negative rail contactor (NC) is then closed, and the method 100 proceeds to step S120.

Steps S114 and S115 include recording a diagnostic code indicative of a hard weld (HW) and a soft weld (SW) condition, respectively. The method 100 then proceeds to step S120.

At step S120, the controller 50 initiates diagnostics of the negative rail contactor (NC). Step S120 may include extracting a second voltage threshold ($V_{TH2}$) from memory (M), e.g., from the SOH threshold data 60 noted above, and then proceeding to step S122.

At step S122, the controller 50 next determines if the capacitor output voltage ($V_O$) exceeds the second voltage threshold, i.e., if $V_O > V_{TH2}$. If so, the method 100 proceeds to step S124. The method 100 proceeds to step S125 if $V_O < V_{TH2}$.

Step S124 includes recording a diagnostic code indicating that the negative rail contactor (NC) is unhealthy before proceeding to step S126.

Step S125 includes recording a diagnostic code indicating the negative rail contactor (NC) is healthy before proceeding to step S127.

At step S126, the controller 50 next determines if the measured current ($I_X$) exceeds a second current threshold $I_{TH2}$, i.e., if $I_X > I_{TH2}$. If so, the method 100 proceeds to step S128. Otherwise, the method 100 proceeds to step S129.

Step S127 includes optionally initiating diagnostics of the charge contactor (CC) if such a contactor is used in a shared-negative rail (−) configuration as shown in FIG. 1. Step S127 is described with reference to FIG. 4.

Steps S128 and S129 include recording a diagnostic code indicative of a hard weld (HW) and a soft weld (SW) condition of the NC, respectively. The method 100 then proceeds to step S130.

Step S130 includes recording a diagnostic code or bit flag that results in prevention of initiation of a diagnostic check of the charge contactor (CC) of FIG. 1. The method 100 is complete with step S130.

FIG. 4 describes step S127 in further detail, i.e., as a sub-method 200 for diagnostics of an AC-DC charging process of the battery pack 12 shown in FIG. 1. For instance, the electrical system 10 may be used as part of an electric vehicle powertrain or other electrified system that is selectively plugged into an offboard charging station, e.g., an AC wall outlet or a DC fast charging station in different embodiments. Therefore, step S202 includes detecting whether the electrical system 10 has been plugged into such a station. Step S202 could entail communication with such a charging station, e.g., via the SAEJ1772 standard for electric vehicle charging. The sub-method 200 then proceeds to step S204 upon detection of the plug-in event.

Step S204 includes waiting for any charging-related equipment or control software or hardware to initialize or "wake up" and then proceeds to step S206.

Step S206 includes measuring the capacitor output voltage ($V_O$) across the capacitor ($C_L$) via the sensor ($S_V$) and reporting the measured value to the controller 50, then proceeding to step S208.

At step S208, the controller 50 commands closing of the main contactor (MC) and then proceeds to step S210.

At step S210, the controller 50 next commands a battery charger/OBCM as noted above, i.e., the HV component 15 of FIG. 1, to a constant voltage mode such that the battery charger/OBCM outputs a constant voltage at a level that is slightly higher than the capacitor output voltage ($V_O$) by a calibrated voltage offset ($\Delta V$), i.e., $V_{CON}=V_O+\Delta V$, wherein $V_{CON}$ is the constant voltage. The method 100 then proceeds to step S212.

At step S212, the controller 50 waits through a calibrated duration and then measures the capacitor output voltage ($V_O$) before proceeding to step S214.

Step S214 includes comparing the capacitor output voltage ($V_O$) to the calibrated voltage offset ($\Delta V$). If $V_O$ is within a calibrated margin of $\Delta V$, the sub-method 200 proceeds to step S215. The method 100 proceeds in the alternative to step S216 if the capacitor output voltage ($V_O$) is outside of the calibrated margin.

At step S215, the controller 50 records a diagnostic code indicative of an unhealthy/welded charge contactor (CC) and proceeds to step S217.

Step S216 includes recording a diagnostic code indicative of a healthy charge contactor (CC). The sub-method 200 is then finished.

At step S217, the controller 50 commands the battery charger/OBCM, i.e., the first HV component 14 of FIG. 1, to a constant current mode such that a calibrated current is fed into the electrical system 10. The method 100 then proceeds to step S219.

Step S219 includes applying the d-axis current command to the switches (SW) of the PIM 20 shown in FIG. 1 based in position of the electric machine 22 as noted above, and then proceeding to step S221.

Step S221 includes measuring an output voltage of the battery charger/OBCM and the capacitor output voltage ($V_O$), and then proceeding to step S223.

At step S223, the controller 50 determines if the difference between the output voltage of the battery charger/OBCM and the capacitor output voltage ($V_O$) exceeds a third calibrated voltage threshold ($V_{TH3}$), which may be recorded as part of the SOH threshold data 60. The sub-method 200 proceeds to step S224 if the difference exceeds the third voltage threshold ($V_{TH3}$). The sub-method 200 proceeds in the alternative to step S225 when this difference is less than the voltage threshold ($V_{TH3}$), i.e., when $V_{OUT}-V_O<V_{TH3}$.

Steps S224 and S225 include recording a diagnostic code indicative of a hard weld (HW) and a soft weld (SW) condition of the charge contactor (CC), respectively. The sub-method 200 is then finished.

FIG. 5 depicts an optional extended "limp-home" and reduced charge sub-method 300 that may be used as part of the method 100 described above. Such a sub-method 300 begins with step S302, wherein the controller 50 determines that the electrical system 10 is in an unhealthy/welded state. For instance, the controller 50 may have completed the above-described diagnostics and determined that the charge contactor (CC) is unhealthy. In this situation, the controller 50 may proceed simultaneously to steps S304 and S306.

Step S304 may include allowing the operator to charge the battery pack 12 with a limited current draw. For instance, a calibrated charge current may be enforced that allows for a slower, more limited charging process as a possible control action in lieu of disabling the charging function entirely.

Step S306 may include allowing use of the electrical system 10, e.g., to output the torque $T_O$ and propel the vehicle 19 shown in FIG. 1. The functionality may be limited in terms of maximum speed of the electrical machine 22 or otherwise, i.e., a "limp home" mode may be enabled in lieu of disabling the propulsion function entirely. The sub-method 300 then proceeds to step S308.

At step S308 the controller 50 may increment a counter and thereby count a number of on/off key cycles or drive cycles of the vehicle 19, or similar power on/off events in non-vehicle applications. The controller 50 then proceeds to step S310.

Step S310 includes comparing the present counter value to a calibrated threshold count and repeating step S306 when the number of counted key cycles is less than the calibrated threshold count. The sub-method 300 proceeds to step S312 when the threshold count is exceeded.

Step S312 may include setting a diagnostic code and preventing further operation of the electrical system 10.

Referring to FIG. 6, a table 40 depicts multiple possible control actions that may be executed by the controller 50 as part of the method 100 when used with the example vehicle 19 of FIG. 1. Table 40 lists different diagnosed states of health (SOH) of the main contactor (MC), neutral rail contactor (NC), and charge contactor (CC), with the SOH abbreviated as healthy (H) and unhealthy (U), and with an unhealthy SOH further represented as either soft-welded or hard-welded (S/H), respectively. The contract actions are listed as "drive allowed" (CA-D), limited drive cycle/power capability (L/Y), and "charging allowed" (CA-C). Limited current draw (D/Y), no (N), and yes (Y) are also used in table 40.

For instance, when the master contactor (MC) is healthy, full drive capability is enabled when the negative rail contactor (NC) is also healthy, with limited drive cycle/power capability enabled when the negative rail contactor (NC) is unhealthy. Regardless of the SOH of the negative rail contactor (NC), a diagnosis of an unhealthy main contactor (MC) results in limited drive cycle/power capability (L/Y). Thus, if a soft weld is present in the main contactor (MC) or the charge contactor (CC), the controller 50 may, as a control action, de-rate an auxiliary power module, e.g., the HV component 17 of FIG. 1, during propulsion if needed. This is unlike approaches that tend to disable vehicle drive function in response to a welded contactor.

Table 40 also details charging control actions in column CA-C. With all three contactors (MC, NC, CC) diagnosed as healthy, full charging is allowed. With the main contactor (MC) healthy, limited current draw (D/Y) is still permitted for charging regardless of the diagnosed SOH of the negative rail contactor (NC) and the charge contactor (CC). Charging is disabled (N) whenever the main contactor (MC) is diagnosed as being unhealthy.

Therefore, possible control actions include allowing the vehicle 19 to be propelled via the electric machine 22 in at least a limited capacity regardless of the state of health of the main contactor (MC). Likewise, the controller 50 can prevent charging of the battery pack 12 when the SOH of the main contactor (MC) is unhealthy/hard-welded, and can do the same when the SOH of the main contactor (MC) is unhealthy/soft-welded. Limited charging of the battery pack 12 may be enabled when the charge contactor (CC) is unhealthy/hard-welded or unhealthy/soft-welded and the main contactor (MC) is healthy/not welded, with no charging of the battery pack 12 permitted when the main contactor (MC) is in unhealthy. If the charge contactor (CC) is hard-welded and the main contactor (MC) and negative rail contactor (NC) are both healthy, charging of the battery pack 12 is permitted. If the charge contactor (CC) is soft welded, however, charging capability is reduced or slowed.

When the main contactor (MC) and negative rail contactor (NC) are hard-welded, an operator of the vehicle 19 or other system using the electrical system 10 can be notified of this without immediately disabling operation of the electrical system 10. Soft welded contactors are treated by allowing drive to continue in a "limp home" mode. These and other control actions will be apparent from table 40, which may be modified as needed depending on the particular application.

Using the method 100 and electrical system 10 described above, the electric machine 22 and active discharge current from the capacitor ($C_L$) are used to diagnose the SOH of the main, negative rail, and charge contactors (MC, NC, CC). The method 100 allows an operator to enjoy continued performance of the electrical system 10, possibly in a reduced capacity, to afford time to service the electrical system 10 even after experiencing a welded contactor condition. The controller 50 sequentially optimizes the open/close sequence for all contactors used in the electrical system 10 to individually determine the SOH of each contactor. Additionally, the controller 50 is able to use the constant voltage/current capability of an onboard battery charger/OBCM in some embodiments to enable charge of the battery pack 12 even after a welded contactor condition is experienced. Differentiation of the SOH of each contactor is thus enabled.

While the best modes for carrying out the disclosure have been described in detail, those familiar with the art to which this disclosure relates will recognize various alternative designs and embodiments for practicing the disclosure within the scope of the appended claims.

The invention claimed is:

1. An electrical system comprising:
a high-voltage bus having positive and negative rails;
a battery pack connected to the positive and negative rails;
a power inverter module (PIM) connected to the battery pack and having a capacitor, a voltage sensor configured to measure an output voltage across the capacitor, and a plurality of semiconductor switches;
an electric machine that is electrically connected to the PIM, and having a plurality of phase legs each with a corresponding phase winding and resistive path;
a first contactor electrically connecting the PIM to the positive rail; and
a controller in communication with the semiconductor switches, the voltage sensor, and the current sensors, and programmed to open the first contactor in response to a power-off event of the electrical system, command a discharge of the link capacitor through the resistive paths of the electric machine via control of the semiconductor switches, diagnose a state of health (SOH) of the first contactor as being one of three possible SOH using a first threshold decay rate of the output voltage upon opening the first contactor, and execute a control action with respect to the electrical system using the diagnosed SOH, wherein the three possible SOH are an unhealthy/hard-welded contactor condition, an unhealthy/soft-welded contactor condition, and a healthy/normally-functioning contactor condition.

2. The electrical system of claim 1, wherein the controller is programmed to command a d-axis current of the electric machine after opening the first contactor to thereby command the discharge of the capacitor.

3. The electrical system of claim 1, further comprising: a pre-charge circuit having a pre-charge resistor and a pre-charge switch, and a second contactor positioned between a negative terminal of the battery pack and the negative rail, wherein the controller is further programmed to close the first contactor, charge the link capacitor via the pre-charge circuit, close the second contactor after the link capacitor is charged above a pre-charge threshold, and then diagnose an SOH of the second contactor as being one of the three possible SOH using a second threshold voltage decay rate of the output voltage.

4. The electrical system of claim 3, further comprising: an onboard charging module (OBCM) configured to selectively output a constant voltage or a constant current in response to an corresponding input signal from the controller, and a third contactor positioned between the OBCM and the positive rail, wherein the controller is further programmed, when the second contactor has the healthy/normally-functioning condition, to: detect a plug-in event of the electrical system, measure the output voltage, close the first contactor, command a constant voltage from the OBCM at a level higher by a calibrated voltage offset than the measured output voltage, measure the output voltage after a calibrated duration as a second measured capacitor output voltage, and diagnose the SOH of the third contactor using the second measured capacitor output voltage and the calibrated voltage offset.

5. The electrical system of claim 4, wherein when the SOH is the unhealthy/hard-welded or unhealthy/soft-welded contactor condition, the controller is further configured to set the OBCM to output the constant current, discharge the link capacitor through the electric machine, measure an output voltage of the OBCM and the output voltage, calculate a difference between the measured output voltage and the measured output voltage, and diagnose which of the unhealthy/hard-welded and unhealthy/soft-welded conditions are present by comparing the calculated difference to a third voltage threshold.

6. The electrical system of claim 5, wherein the control action includes allowing limited charging of the battery pack when the SOH of the third contactor is unhealthy/hard-welded or unhealthy/soft-welded and the SOH of the first contactor is healthy/not welded.

7. The electrical system of claim 5, wherein the control action includes preventing charging of the battery pack when the SOH of the first contactor is unhealthy/hard-welded or unhealthy/soft-welded.

8. The electrical system of claim 7, wherein the electric machine is a traction motor of a vehicle.

9. The electrical system of claim 8, wherein the control action includes allowing the vehicle to be propelled via the traction motor in at least a limited capacity regardless of the diagnosed SOH of the first contactor.

10. The electrical system of claim 9, wherein the controller is programmed to disable propulsion of the vehicle after a calibrated number of drive cycles of the vehicle when operating in the limited capacity.

11. A vehicle comprising:
a high-voltage bus having positive and negative rails;
a battery pack connected to the positive and negative rails;
a power inverter module (PIM) connected to the battery pack and having a capacitor, a voltage sensor configured to measure an output voltage across the capacitor, and a plurality of semiconductor switches;
an traction motor that is electrically connected to the PIM, and having a plurality of phase legs each with a corresponding phase winding and resistive path, wherein the traction motor outputs torque to propel the vehicle;
a first contactor electrically connecting the PIM to the positive rail; and
a controller in communication with the semiconductor switches, the voltage sensor, and the current sensors, and programmed to open the first contactor in response to a power-off event of the electrical system, command a discharge of the link capacitor through the resistive paths of the electric machine by commanding a d-axis current of the electric machine after opening the first contactor, diagnose a state of health (SOH) of the first contactor as being one of three possible SOH using a first threshold decay rate of the output voltage upon opening the first contactor, and execute a control action with respect to the electrical system using the diagnosed SOH, wherein the three possible SOH are an unhealthy/hard-welded contactor condition, an unhealthy/soft-welded contactor condition, and a healthy/normally-functioning contactor condition.

12. The vehicle of claim 11, further comprising: a pre-charge circuit having a pre-charge resistor and a pre-charge switch, and a second contactor positioned between a negative terminal of the battery pack and the negative rail, wherein the controller is further programmed to close the first contactor, charge the link capacitor via the pre-charge circuit, close the second contactor after the link capacitor is charged above a pre-charge threshold, and then diagnose an SOH of the second contactor as being one of the three possible SOH using a second threshold voltage decay rate of the output voltage.

13. The vehicle of claim 12, further comprising:
an onboard charging module (OBCM) configured to selectively output a constant voltage or a constant current in response to an input signal; and
a third contactor positioned between the OBCM and the positive rail;
wherein the controller is further programmed, when the second contactor has the healthy/normally-functioning condition, to detect a plug-in event of the electrical system, measure the output voltage, close the first contactor, command a constant voltage from the OBCM at a level higher by a calibrated voltage offset than the measured output voltage, measure the output voltage across the capacitor after a calibrated duration as a second measured capacitor output voltage, and diagnose the SOH of the third contactor using the second measured capacitor output voltage and the calibrated voltage offset.

14. The vehicle of claim 13, wherein when the SOH is the unhealthy/hard-welded or unhealthy/soft-welded condition, the controller is further configured to set the OBCM to output the constant current, discharge the link capacitor through the electric machine, measure an output voltage of the OBCM and the output voltage, calculate a difference between the measured output voltage and the measured output voltage, and diagnose which of the unhealthy/hard-welded and unhealthy/soft-welded conditions are present by comparing the calculated difference to a third voltage threshold.

15. A method for diagnosing a state of health (SOH) of a high-voltage contactor in an electrical system having a high-voltage bus with positive and negative rails, a battery pack connected to the positive and negative rails, a power inverter module (PIM) connected to the battery pack, an electric machine that is electrically connected to the PIM and that has a plurality of phase legs each with a corresponding phase winding and resistive path, a first contactor electrically connecting the PIM to the positive rail, and a controller in communication with the PIM, wherein the PIM includes a capacitor, a voltage sensor configured to measure an output voltage across the capacitor, and a plurality of semiconductor switches, the method comprising:
opening the first contactor in response to a power-off event of the electrical system;
commanding a discharge of the capacitor, via the controller, through the resistive paths of the electric machine, including commanding a d-axis current of the electric machine;
diagnosing an SOH of the first contactor as being one of three SOH using a first threshold decay rate of the output voltage upon opening the first contactor; and
executing one of a plurality of control actions with respect to the electrical system using the diagnosed SOH, wherein the three possible SOH are an unhealthy/hard-welded contactor condition, an unhealthy/soft-welded contactor condition, and a healthy/normally-functioning contactor condition.

16. The method of claim 15, wherein the electrical system includes a pre-charge circuit having a pre-charge resistor and a pre-charge switch, and a second contactor positioned between a negative terminal of the battery pack and the negative rail, further comprising:
closing the first contactor;
charging the link capacitor via the pre-charge circuit;
closing the second contactor after the link capacitor is charged above a pre-charge threshold; and
diagnosing an SOH of the second contactor as being one of the three possible SOH using a second threshold voltage decay rate of the output voltage.

17. The method of claim 15, wherein the electrical system includes an onboard charging module (OBCM) configured to selectively output a constant voltage or a constant current in response to a corresponding input signal, and a third contactor positioned between the OBCM and the positive rail, the method further comprising:
measuring the output voltage after detecting a plug-in event of the electrical system when the second contactor has the healthy/normally-functioning condition;
closing the first contactor;
commanding a constant voltage from the OBCM at a level that is higher by a calibrated voltage offset than the measured output voltage;
measuring the output voltage after a calibrated duration as a second measured capacitor output voltage; and
diagnosing the SOH of the third contactor using the second measured capacitor output voltage and the calibrated voltage offset.

18. The method of claim 17, the method further comprising:
- when the SOH is the unhealthy/hard-welded or unhealthy/soft welded condition, setting the OBCM to output the constant current;
- discharging the link capacitor through the electric machine;
- measuring an output voltage of the OBCM and the output voltage;
- calculating a difference between the measured output voltage of the OBCM and the output voltage of the capacitor; and
- diagnosing which of the unhealthy/hard-welded and unhealthy/soft-welded condition is present by comparing the calculated difference to a third voltage threshold.

19. The method of claim 18, wherein the electric machine is a traction motor of a vehicle, and wherein the control actions include:
- allowing normal driving operation of the vehicle when the SOH of the first and second contactors are unhealthy/hard-welded;
- allowing limited or "limp home" driving operation of the vehicle when the SOH of the first or second contactors are unhealthy/soft-welded;
- disabling charging of the battery pack when the SOH of the main contactor is unhealthy/hard-welded or unhealthy/soft-welded; and
- when the first and second contactors are healthy/not welded, allowing full charging of the battery pack when the SOH of the third contactor is unhealthy/hard-welded and allowing limited charging when the SOH of the third contactor is unhealthy/soft-welded.

* * * * *